(12) United States Patent
Feyh et al.

(10) Patent No.: US 9,302,906 B2
(45) Date of Patent: Apr. 5, 2016

(54) CAPACITIVE PRESSURE SENSOR AND METHOD

(71) Applicant: Robert Bosch GmbH, Stuttgart (DE)

(72) Inventors: Ando Feyh, Palo Alto, CA (US); Andrew B. Graham, Redwood City, CA (US)

(73) Assignee: Robert Bosch GmbH, Stuttgart (DE)

( * ) Notice: Subject to any disclaimer, the term of this patent is extended or adjusted under 35 U.S.C. 154(b) by 115 days.

(21) Appl. No.: 14/042,861

(22) Filed: Oct. 1, 2013

(65) Prior Publication Data

US 2014/0231939 A1    Aug. 21, 2014

Related U.S. Application Data

(60) Provisional application No. 61/709,040, filed on Oct. 2, 2012.

(51) Int. Cl.
    *G01L 9/00*          (2006.01)
    *B81C 1/00*         (2006.01)
    *B81B 3/00*         (2006.01)

(52) U.S. Cl.
    CPC ........... *B81C 1/00476* (2013.01); *B81B 3/0021* (2013.01); *B81C 1/00182* (2013.01); *G01L 9/0042* (2013.01); *G01L 9/0073* (2013.01); *B81B 2201/0264* (2013.01)

(58) Field of Classification Search
None
See application file for complete search history.

(56) References Cited

U.S. PATENT DOCUMENTS

| | | | |
|---|---|---|---|
| 6,383,832 B1 | 5/2002 | Nakabayashi | |
| 6,521,965 B1 | 2/2003 | Lutz | |
| 6,677,679 B1* | 1/2004 | You et al. ....................... | 257/758 |
| 8,426,289 B2 | 4/2013 | Graham et al. | |
| 2003/0079548 A1 | 5/2003 | Potter et al. | |
| 2004/0166603 A1 | 8/2004 | Carley | |
| 2009/0108381 A1* | 4/2009 | Buchwalter et al. ........... | 257/415 |
| 2012/0261822 A1 | 10/2012 | Graham et al. | |

FOREIGN PATENT DOCUMENTS

DE        102007007178 A1    8/2007

OTHER PUBLICATIONS

International Search Report and Written Opinion corresponding to PCT Application No. PCT/US2013/062851, mailed Feb. 3, 2014 (11 pages).

* cited by examiner

*Primary Examiner* — Evan Pert
*Assistant Examiner* — Shaka White
(74) *Attorney, Agent, or Firm* — Maginot Moore & Beck LLP

(57) ABSTRACT

In one embodiment, a method of forming a MEMS device includes providing a silicon wafer with a base layer and an intermediate layer above an upper surface of the base layer. A first electrode is defined in the intermediate layer and an oxide portion is provided above an upper surface of the intermediate layer. A cap layer is provided on an upper surface of the oxide portion and a second electrode is defined in the cap layer. The method further includes etching the oxide portion to form a cavity such that when the second electrode and the cavity are projected onto the intermediate layer, the projected second electrode encompasses the projected cavity.

13 Claims, 5 Drawing Sheets

CAPACITIVE PRESSURE SENSOR AND METHOD

This application claims the benefit of U.S. Provisional Application No. 61/709,040 filed Oct. 2, 2012.

FIELD OF THE INVENTION

The present disclosure relates to micro electrical mechanical system (MEMS) sensors, more particularly, to capacitive MEMS pressure sensors.

BACKGROUND

A capacitive MEMS pressure sensor requires two electrodes that move relative to each other under an applied pressure. This configuration is most often accomplished by having a fixed electrode (hereafter called the lower electrode) formed in a substrate while a moveable electrode (hereafter called the upper electrode) is provided in a deformable membrane which is exposed to the pressure that is to be sensed. One or more of the electrodes are typically formed by deposition of a conductive film, electrical isolation of a conductive layer, or by simply adding a spacer layer between two conductive materials.

In capacitive MEMS pressure sensors that incorporate a deposited epi-polysilicon layer to form the deformable membrane, dielectric spacers are typically used to isolate the upper electrode within the membrane. A pressure sensor with this electrode configuration can then be stacked on top of preexisting structures to create wafer-scale encapsulation processes that are capable of producing a wide range of devices. In these fabrication iterations, however, silicon nitride dielectric spacers are typically used to provide the electrode isolation.

What is needed, therefore, is a capacitive pressure that does not require additional materials to provide the electrical isolation between the electrodes. In addition, a method of producing such a capacitive pressure sensor that incorporates existing epitaxial silicon wafer-scale encapsulation techniques would be beneficial.

SUMMARY

In accordance with one embodiment, a method of forming a MEMS device includes providing a base layer, providing an intermediate layer above an upper surface of the base layer, defining a first electrode in the intermediate layer, providing an oxide portion above an upper surface of the intermediate layer, providing a cap layer on an upper surface of the oxide portion, defining a second electrode in the cap layer, and etching the oxide portion to form a cavity such that when the second electrode and the cavity are projected onto the intermediate layer, the projected second electrode encompasses the projected cavity.

In another embodiment, a MEMS device with a highly impermeable cap layer includes a base layer, an intermediate layer above an upper surface of the base layer, a first electrode defined in the intermediate layer, a cap layer above an upper surface of the intermediate layer, a cavity defined by the cap layer and the intermediate layer, the cavity at least partially directly above the first electrode, and a second electrode in the cap layer, the second electrode extending laterally beyond the cavity such that when the second electrode and the cavity are projected onto the intermediate layer, the projected second electrode encompasses the projected cavity.

DESCRIPTION

Figure 1:
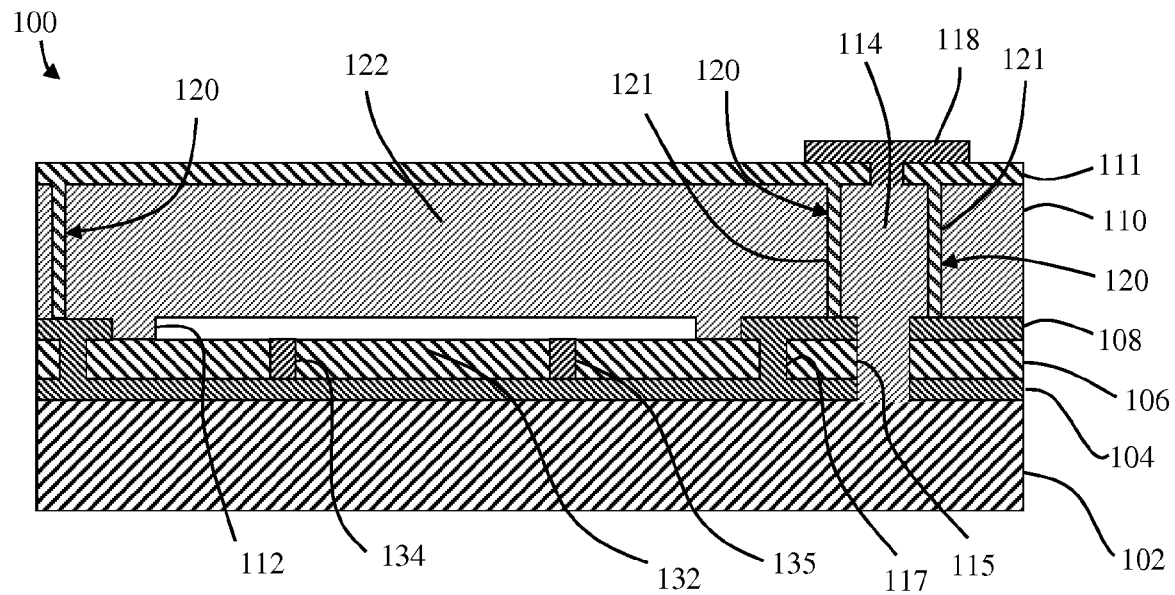
FIG. 1 depicts a side cross-sectional view of a sensor device according to a first embodiment.

For the purpose of promoting an understanding of the principles of the disclosure, reference will now be made to the embodiments illustrated in the drawings and described in the following written specification. It is understood that no limitation to the scope of the disclosure is thereby intended. It is further understood that the disclosure includes any alterations and modifications to the illustrated embodiments and includes further applications of the principles of the disclosure as would normally occur to one skilled in the art to which this disclosure pertains.

Figure 2:
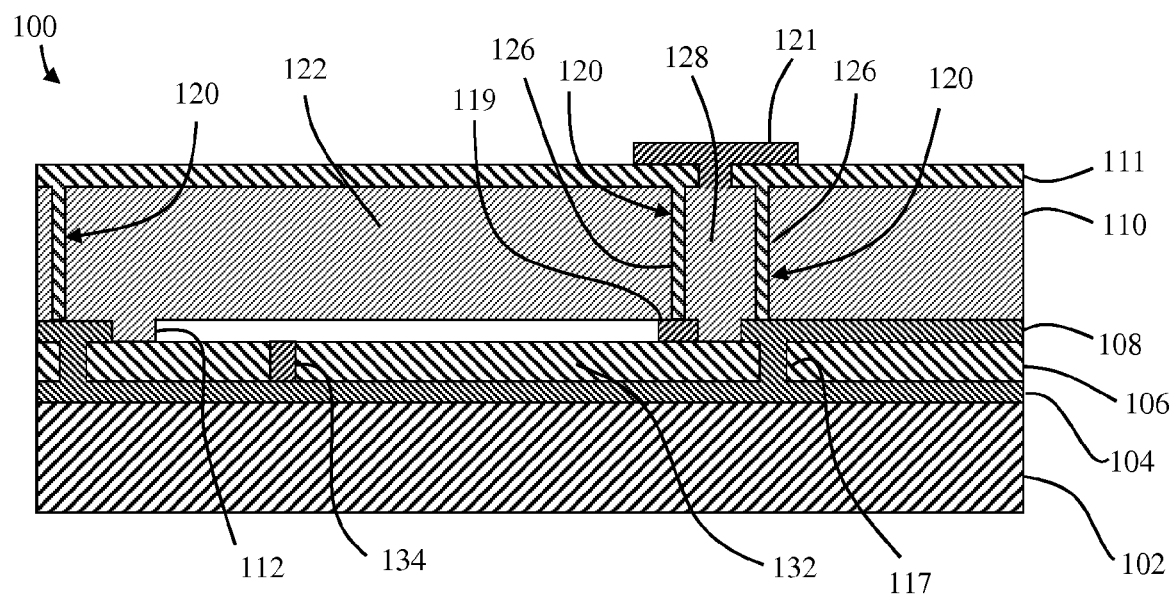
FIG. 2 depicts a side cross-sectional view of a contact area of a lower electrode of the sensor device of FIG. 1 according to the first embodiment.

FIGS. 1 and 2 depict a pressure sensor 100 according to a first embodiment. The pressure sensor 100 includes a base layer 102, a buried oxide layer 104, and an intermediate layer 106. An oxide layer 108 separates the intermediate layer 106 from a cap layer 110. A passive layer 111 is located above the cap layer 110.

Within the intermediate layer 106, a first electrode 132 is defined by two spacers 134 and 135. The spacers 134 and 135 include a nitride portion that extends through the intermediate layer 106 and between the buried oxide layer 104 and the oxide layer 108. The first electrode 132 is isolated from the cap layer 110 by a cavity 112 etched from a portion of the oxide layer 108. The cavity 112 is etched through vent holes (e.g., vent holes 474 in FIG. 10) that are closed by the cap layer 110.

A second electrode 122 is located above the first electrode 132 and electrically isolated from the first electrode 132 by the cavity 112. The second electrode 122 is isolated from the rest of the cap layer 110 by etched portions 120. The etched portions 120 include an oxide portion which extends through the cap layer 110 and between the oxide layer 108 and the passive layer 111. The etched portions 120 are positioned such that when the second electrode 122 and the cavity 112 are projected onto the intermediate layer 106, the projected second electrode encompasses the projected cavity.

First portions 121 of the etched portions 120 electrically isolate a first connector 114 in the cap layer 110 from the rest of the cap layer 110. The first connector 114 includes a first connector lower portion 115 that extends through the oxide layer 108, the intermediate layer 106, and the buried oxide layer 104 and is in electrical communication with the base layer 102. The first connector lower portion 115 is isolated from the remainder of the intermediate layer 106 by at least one etched portion 117 that includes an oxide portion which extends from the buried oxide layer 104 to the oxide layer 108. A first bond pad or trace 118 is located above the passive layer 111 and in electrical communication with the connector 114.

Second portions 126 of the etched portions 120 electrically isolate a second connector 128 in the cap layer 110 from the rest of the cap layer 110. The second connector 128 is in electrical communication with the first electrode 132 at a portion of the first electrode 132 that is electrically isolated from the remainder of the intermediate layer 106 by the spacer 134 and the etched portion 117. As best shown in FIG. 2, a portion of the oxide layer 108 includes an etched portion 119 that has a nitride portion that is positioned between the intermediate layer 106 and the cap layer 110. The etched portion 119 provides an etch stop for a portion of the cavity 112 and for at least one of the second portions 126 of the etched portions 120. A second bond pad or trace 121 is located above the passive layer 111 and in electrical communication with the connector 128.

Figure 3:
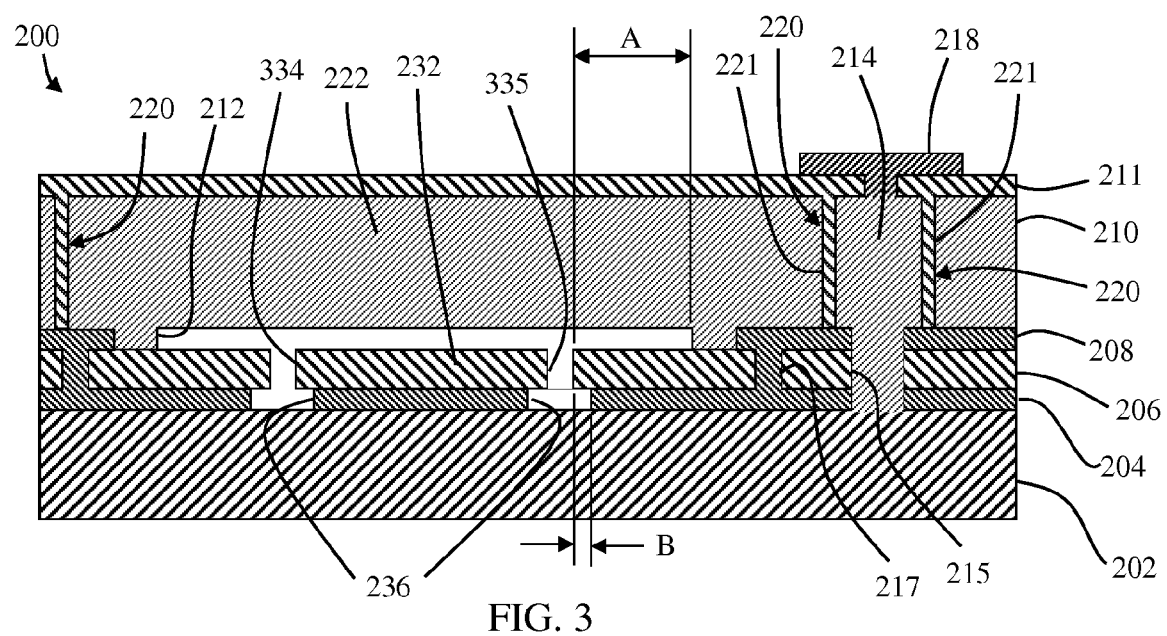
FIG. 3 depicts a side cross-sectional view of a sensor device according to a second embodiment.
Figure 4:
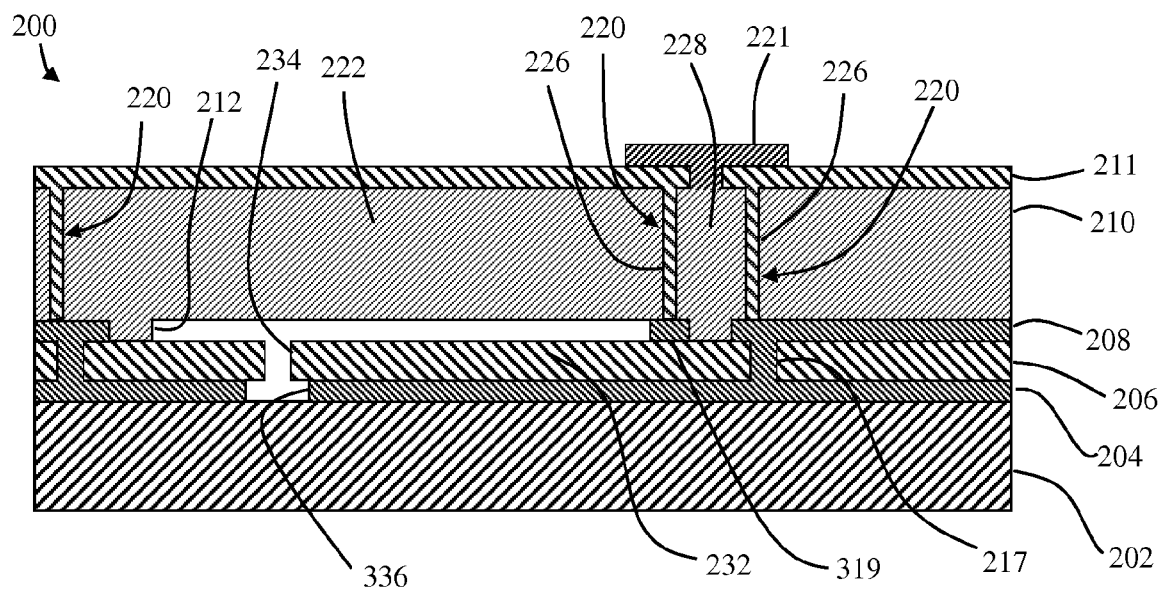
FIG. 4 depicts a side cross-sectional view of a contact area of a lower electrode of the sensor device of FIG. 3 according to the second embodiment.

FIGS. 3 and 4 depict a pressure sensor 200 according to a second embodiment. In the figures, elements of the sensor 200 that are similar to elements of the sensor 100 of FIGS. 1 and 2 are designated by like reference numerals incremented by 100. For example, the base layer the sensor 100 is designated by reference numeral 102 while a similar base layer of the sensor 200 is designated by reference numeral 202. New or modified elements of the sensor 200 are designated by reference numerals incremented by 200.

The pressure sensor 200 includes a base layer 202, a buried oxide layer 204, and an intermediate layer 206. An oxide layer 208 separates the intermediate layer 206 from a cap layer 210. A passive layer 211 is located above the cap layer 210.

Within the intermediate layer 206, a first electrode 232 is defined by two etched portions 334 and 335 which isolate the first electrode 232 from the rest of the intermediate layer 206. The first electrode 232 is isolated from the cap layer 210 by a cavity 212 etched from a portion of the oxide layer 208. An under-etch cavity 236 etched from a portion of the buried oxide layer 204 is positioned adjacent to each of the etched portions 334 and 335. The cavity 212, the etched portions 334 and 335, and the under-etch cavities 236 are etched through vent holes (e.g., vent holes 574 in FIG. 21) that are closed by the cap layer 210.

With particular reference to FIG. 3, the cavity 212 has a first length portion (A) extending laterally from an outside edge of the etched portions 334 and 335. The under-etch cavities 236 have a second length portion (B) extending laterally from the same edge of the etched portions 334 and 335 from which the first length portion (A) of the cavity 212 extends. In the embodiment shown, the first length portion (A) of the cavity 212 is greater than the second length portion (B) of the under-etch cavities 236 to provide mechanically stable clamping of the cap layer 210.

A second electrode 222 is located above the first electrode 232 and electrically isolated from the first electrode 232 by the cavity 212. The second electrode 222 is isolated from the rest of the cap layer 210 by etched portions 220. The etched portions 220 include an oxide portion which extends through the cap layer 210 and between the oxide layer 208 and the passive layer 211. The etched portions 220 are positioned such that when the second electrode 222 and the cavity 212 are projected onto the intermediate layer 206, the projected second electrode encompasses the projected cavity.

First portions 221 of the etched portions 220 electrically isolate a first connector 214 in the cap layer 210 from the rest of the cap layer 210. The first connector 214 includes a first connector lower portion 215 that extends through the oxide layer 208, the intermediate layer 206, and the buried oxide layer 204 and is in electrical communication with the base layer 202. The first connector lower portion 215 is isolated from the remainder of the intermediate layer 206 by at least one etched portion 217 that includes an oxide portion which extends from the buried oxide layer 204 to the oxide layer 208. A first bond pad or trace 218 is located above the passive layer 211 and in electrical communication with the connector 214.

Second portions 226 of the etched portions 220 electrically isolate a second connector 228 in the cap layer 210 from the rest of the cap layer 210. The second connector 228 is in electrical communication with the first electrode 232 at a portion of the first electrode 232 that is electrically isolated from the remainder of the intermediate layer 206 by the etched portion 334 and the etched portion 217. As best shown in FIG. 4, the oxide layer 208 includes a second oxide portion 319 that is positioned between the intermediate layer 206 and the cap layer 210. The second oxide portion 319 provides an etch stop for a portion of the cavity 212 and for at least one of the second portions 226 of the etched portions 220. A second bond pad or trace 221 is located above the passive layer 211 and in electrical communication with the connector 228.

Figure 5:
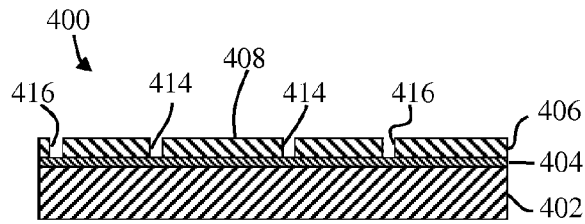
FIGS. 5-17 depict a process for forming the sensor of FIGS. 1 and 2.

A process for forming a sensor such as the pressure sensor 100 is discussed with reference to FIGS. 5-17. Referring initially to FIG. 5, a silicon-on-insulator (SOI) wafer 400 including a base layer 402, a buried oxide layer 404, and an intermediate layer 406 is initially etched to define a first electrode 408 within the intermediate layer 406. The first electrode 408 is defined by a trench portion 414, while other portions of the intermediate layer 406 are electrically isolated by a trench portion 416. In the embodiment shown, the intermediate layer 406 is a highly-doped layer of either mono- or poly-crystalline silicon deposited to a thickness of approximately 100 nm. The intermediate layer 406 can be deposited by chemical vapor deposition (CVD) or, more particularly, low pressure chemical vapor deposition (LPCVD). If desired, the base layer 402 may be a pressure chemical vapor deposition (LPCVD) or an epi-polysilicon layer.

Figure 6:
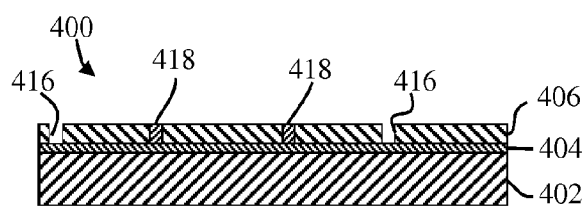
Figure 7:
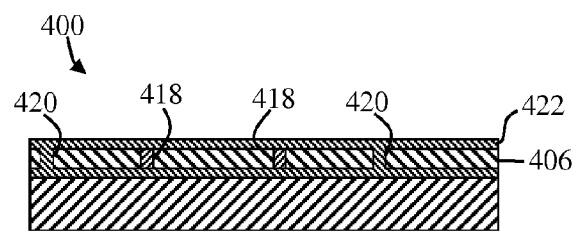

A low stress nitride is used to fill the trench portion 414 with a trench nitride portion 418 as shown in FIG. 6. The trench portion 416 is then filled with a trench oxide portion 420 as shown in FIG. 7 using a conformal oxide deposition. Oxide deposition further results in an oxide layer 422 on the upper surface of the intermediate layer 406. The thickness of the oxide layer 422 sets the gap between two electrodes as discussed more fully below. In one embodiment, the oxide layer 422 is deposited to a thickness of approximately 200 to 3,000 nm. The oxide layer 422 may be planarized by any desired technique such as chemical mechanical polishing (CMP).

Figure 8:
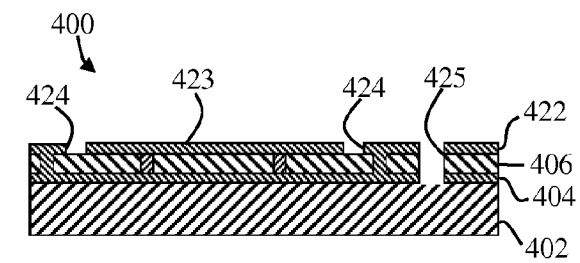

Referring to FIG. 8, the oxide layer 422 is etched to define an oxide portion 423 within the oxide layer 422. The oxide portion 423 is defined by a trench portion 424 which extends through the oxide layer 422 and exposes the upper surface of the intermediate layer 406. A trench portion 425 is also etched through the oxide layer 422, the intermediate layer 406, and the buried oxide layer 404 to expose the upper surface of the base layer 402.

Figure 9:
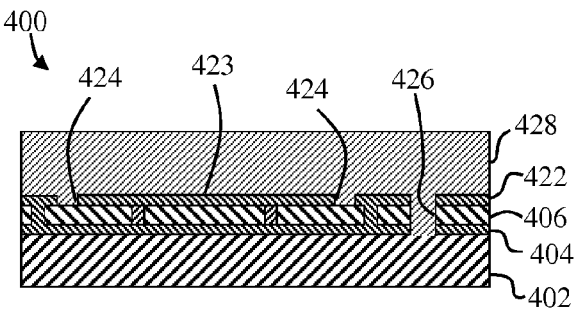

An epi-poly deposition fills the trench portion 425 with a first connector lower portion 426 of epi-poly while depositing a cap layer 428 above the oxide layer 422 and within the trench portion 424 as shown in FIG. 9. The first connector lower portion 426 thus extends from the exposed upper surface of the base layer 402 to the approximate upper surface of the oxide layer 422. In an alternative embodiment, the cap layer 428 may be a single crystal silicon formed using a fusion bonding process followed by grinding/polishing or SmartCut technology to remove the bulk of the bonded wafer. In this alternative embodiment, electrical contacts must be formed after fusion. In a further embodiment, a polished polysilicon cap layer may be used.

Figure 10:
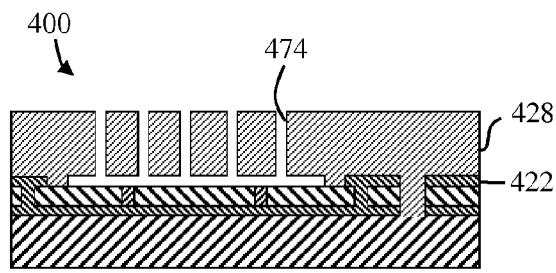
Figure 11:
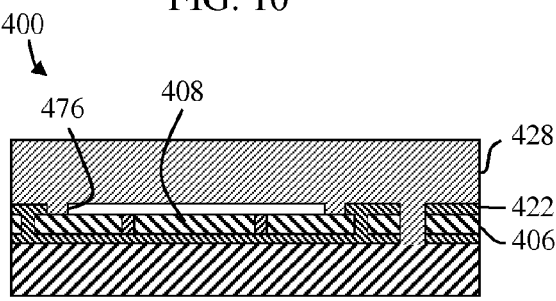

Referring to FIG. 10, after vent holes 474 are formed, a hydrofluoric acid (HF) vapor etch release is performed which releases the oxide portion 423 (FIG. 9) from the cap layer 428. The etched portion of the oxide layer 422 between the upper surface of the first electrode 408 and the lower surface of the cap layer 428 thus sets the gap between the first electrode 408 and the lower surface of what will be the second electrode. A clean high temperature seal is then performed in an epi reactor to seal the vent holes 474. The resulting configuration is shown in FIG. 11 in which the vent holes 474 (FIG. 10) are sealed by the high temperature seal and a cavity 476 is defined by the intermediate layer 406 and the cap layer 428 at least partially directly above the first electrode 408.

Figure 12:
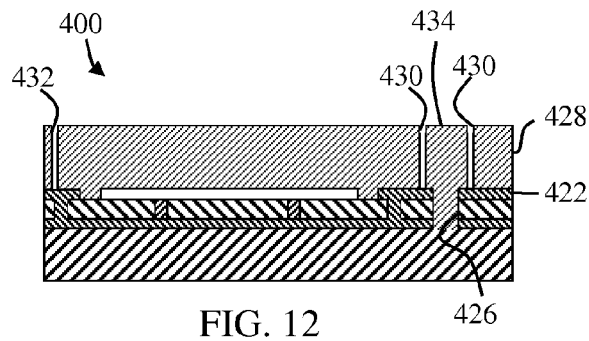
Figure 13:
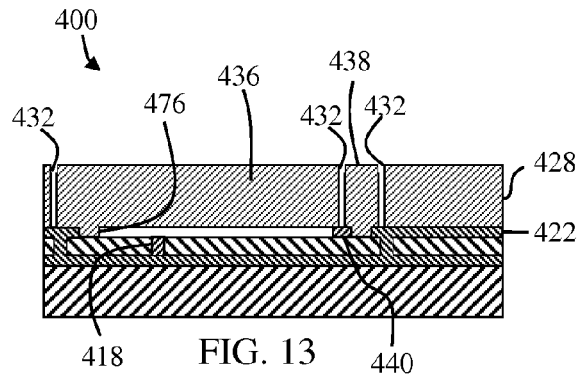

FIGS. 12 and 13 further show trenches 430 and 432 which may be etched after CMP of the cap layer 428. The trench 430 extends from the upper surface of the cap layer 428 to the upper surface of the oxide layer 422 to define a first connector 434 which is in electrical communication with the base layer 402 via the first connector lower portion 426. The trench 432 includes a trench portion that defines a second electrode 436 and a trench portion that defines a second connector 438 for the first electrode 408. In the embodiment shown in FIG. 13, a portion of the oxide layer 422 is etched and filled with a trench nitride portion 440. The trench nitride portion 440 functions as an etch stop for a portion of the trench 432 that defines the second connector 438 and for a portion of the cavity 476 that is etched from the oxide layer 422.

Figure 17:
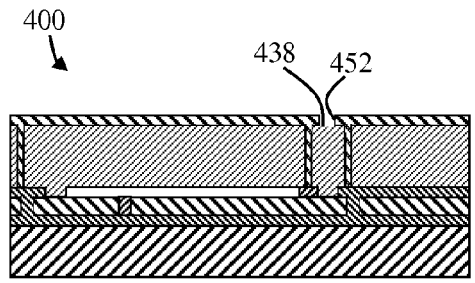
Figure 14:
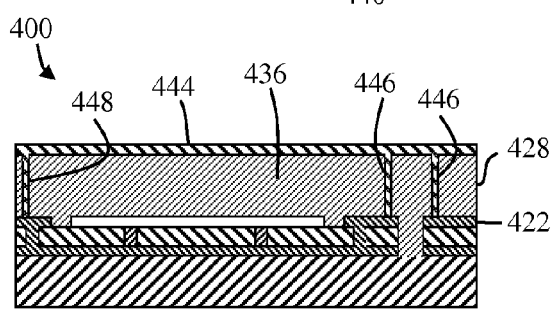
Figure 15:
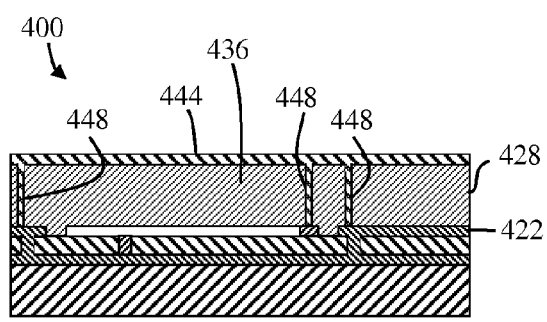
Figure 16:
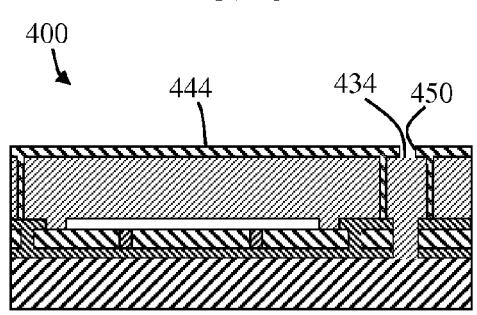

A passivation layer 444 of oxide is then deposited on the upper surface of the cap layer 428 as depicted in FIGS. 14 and 15. The deposited passivation material also fills the trenches 430 and 432 with passivation portions 446 and 448. The passivation portion 448 thus forms a spacer defining the second electrode 436. Referring to FIGS. 16 and 17, the passivation layer 444 is then etched to create an opening 450 to expose an upper surface of the first connector 434 and an opening 452 to expose an upper surface of the second connector 438. A metal layer may then be deposited on the passivation layer 444 and etched to create bond pads or traces, resulting in a configuration such as the configuration of the pressure sensor 100 of FIGS. 1 and 2. If desired, piezoresistors may also be deposited on the passivation layer 444.

Figure 18:
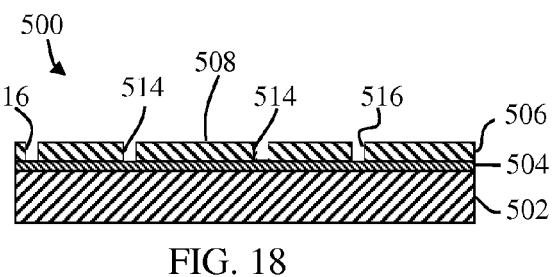
FIGS. 18-24 depict a process for forming the sensor of FIGS. 3 and 4.

The above described process may be modified in a number of ways to provide additional sensor variants. By way of example, FIGS. 18-24 illustrate a modification of the above described process to form a sensor such as the pressure sensor 200 of FIGS. 3 and 4. FIG. 18 depicts a wafer 500 at about the same process step as the wafer 400 in FIG. 5. The wafer 500 includes a base layer 502, a buried oxide layer 504, and an intermediate layer 506 that is etched to define a first electrode 508 therein. FIG. 18 further depicts trench portion 514 which is used to define the first electrode 508 and trench portion 516 which is used to electrically isolate other portions of the intermediate layer 506.

Figure 19:
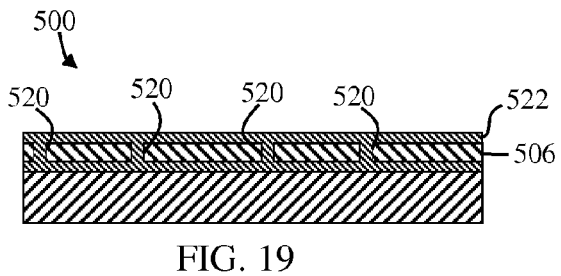
Figure 20:
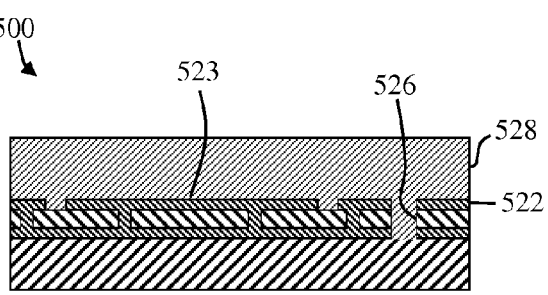
Figure 21:
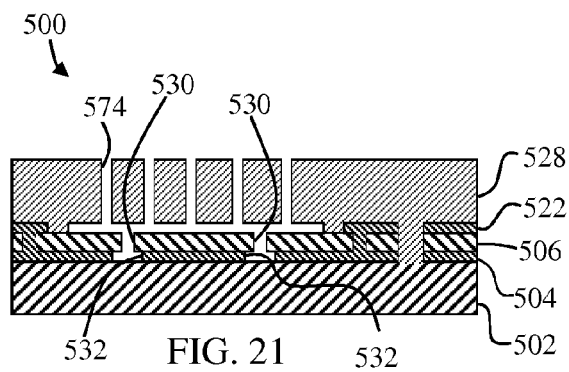

Referring to FIG. 19, the trench portions 514 and 516 are then filled with a trench oxide portion 520 using a conformal oxide deposition. Oxide deposition further results in an oxide layer 522 on the upper surface of the intermediate layer 506. By way of example, FIG. 20 depicts the wafer 500 after an oxide portion 523 is defined within the oxide layer 522 and an epi-poly deposition fills a trench portion with a first connector lower portion 526 of epi-poly while depositing a cap layer 528 above the oxide layer 522. FIG. 21 depicts the wafer 500 after release of the oxide portion 523 through vent holes 574.

The foregoing steps are accomplished substantially in the same manner as similar steps described above with respect to FIGS. 8-10.

Figure 22:
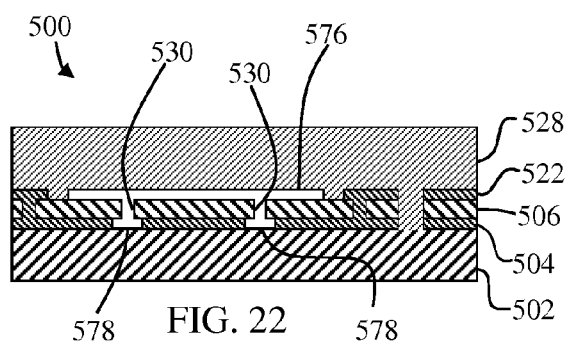

The primary difference between the wafer 400 and the wafer 500, however, is that the release of the oxide portion 523 further releases first portions 530 of the trench oxide portion 520 and second portions of the 532 of the buried oxide layer 504. Accordingly, after the vent holes 574 are sealed as shown in FIG. 22, a cavity 576 is defined by the intermediate layer 506 and the cap layer 528 and positioned at least partially above the first electrode 508. In addition, two under-etch cavities 578 are defined by the base layer 502, the buried oxide layer 504, and the first electrode 508 and positioned at least partially below the first electrode 508. The cavity 576 and the under-etch cavities 578 are interconnected via the released first portions 530 of the trench oxide portion 520.

Figure 23:
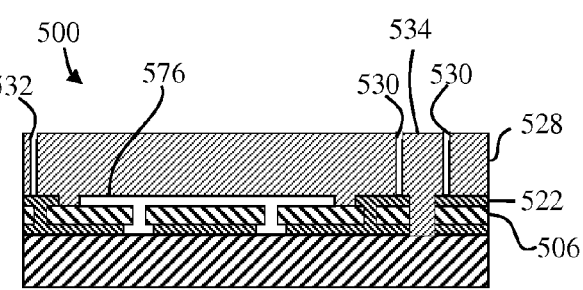
Figure 24:
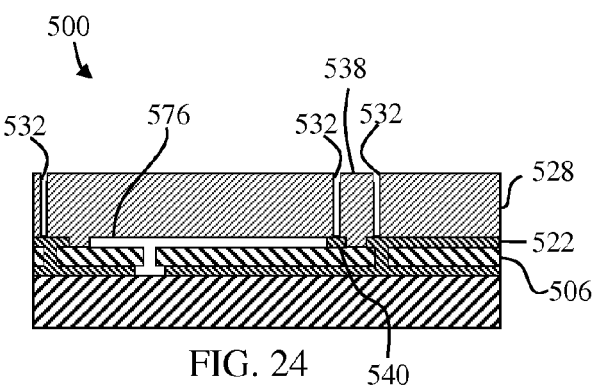

FIGS. 23 and 24 further show trenches 530 and 532 which may be etched after CMP of the cap layer 528. The steps to define a first connector 534, a second electrode 536, and a second connector 538 from the trenches 530 and 532 are accomplished substantially in the same manner as similar steps described above with respect to FIGS. 12 and 13. As shown in FIG. 24, however, one difference between the wafer 400 and the wafer 500 is that the oxide layer 522 does not include a trench nitride portion, such as the trench nitride portion 440 of the wafer 400 in FIG. 13. Instead, a timed etching process, such as a timed HF etching process, can be used to form the cavity 576 and ensure that a portion 540 of the oxide layer 522 remains between the cavity 576 and the second connector 538. From the wafer 500 depicted in FIG. 24, the configuration of the pressure sensor 200 of FIGS. 3 and 4 can be achieved by implementing the process steps described above with reference to FIGS. 14-17.

The sensor 100 depicted in FIGS. 1 and 2 and constructed according to the process discussed with reference to FIGS. 5-17 has advantages over existing capacitive MEMS pressure sensors. In particular, the process that produces the sensor 100 saves one (1) trench operation, one (1) refill operation, and one (1) back-etch operation during its implementation and allows for a standard encapsulation process.

The sensor 200 depicted in FIGS. 3 and 4 and constructed according to the process discussed with reference to FIGS. 18-24 has similar advantages over existing capacitive MEMS pressure sensors. In particular, the process that produces sensor 200 saves one (1) trench operation, two (2) refill operations, and two (2) back-etch operations and allows for a standard encapsulation process. Moreover, no silicon nitride is required during this fabrication process, allowing for even more process versatility.

The sensors 100/200 have further advantages over existing capacitive MEMS pressure sensors. Even after the cap layer 110/210 of each sensor 100/200 is trenched to form the etched portions 120/220, the cap layer 110/210 remains highly impermeable. This high impermeability results from the positioning of the etched portions 120/220 outside of a deflective area of the cap layer 110/210. The filling of the etched portions 120/220 with oxide instead of dielectric material also supports the high impermeability. The hermeticity of the second electrode 122/222 substantially improves the long-term reliability of the sensors 100/200.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. A method of forming a MEMS device comprising:
    providing a base layer;
    providing an intermediate layer above an upper surface of the base layer;
    defining a first electrode in the intermediate layer such that a portion of the intermediate layer is at least a portion of the first electrode;
    providing an oxide portion above an upper surface of the intermediate layer;
    providing a cap layer on an upper surface of the oxide portion;
    defining a second electrode in the cap layer such that a portion of the cap layer is at least a portion of the second electrode; and
    etching the oxide portion to form a cavity such that when the second electrode and the cavity are projected onto the intermediate layer, the projected second electrode encompasses the projected cavity.

2. The method of claim 1, wherein providing an oxide portion above an upper surface of the intermediate layer comprises defining the oxide portion from an oxide layer provided above the upper surface of the intermediate layer.

3. The method of claim 2, further comprising:
    etching a stop trench extending through the oxide layer; and
    depositing a stop material portion within the stop trench.

4. The method of claim 3, wherein the stop material portion comprises silicon nitride.

5. The method of claim 3, wherein etching the oxide portion to form a cavity comprises etching the oxide portion to a boundary defined by the stop material portion.

6. The method of claim 2, wherein defining a second electrode in the cap layer comprises:
    etching a second electrode perimeter defining trench extending through the cap layer and stopping at the oxide layer; and
    depositing a second material portion within the second electrode perimeter defining trench.

7. The method of claim 6, wherein the second material portion comprises oxide.

8. The method of claim 1, wherein defining a first electrode in the intermediate layer comprises:
    etching a first electrode perimeter defining trench extending through the intermediate layer and stopping at a buried oxide layer positioned between the intermediate layer and the base layer; and
    depositing a first material portion within the first electrode perimeter defining trench.

9. The method of claim 8, wherein the first material portion comprises silicon nitride.

10. The method of claim 1, wherein defining a first electrode in the intermediate layer comprises:
    etching a first electrode perimeter defining trench extending through the intermediate layer and stopping at a buried oxide layer positioned between the intermediate layer and the base layer, wherein the buried oxide layer comprises a third material portion; and
    depositing a fourth material portion within the first electrode perimeter defining trench and on the intermediate layer to fill the first electrode perimeter defining trench and form the oxide portion.

11. The method of claim 10, wherein the third material portion and the fourth material portion comprise oxide.

12. The method of claim 10, wherein etching the oxide portion to form a cavity comprises:
    etching the fourth material from the first electrode perimeter defining trench; and
    etching a portion of the third material from the buried oxide layer to form an under-etch cavity.

13. The method of claim 12, wherein
    the cavity etched from the oxide portion has a first length portion extending laterally from an edge of the first electrode perimeter defining trench;
    the under-etch cavity has a second length portion extending laterally from the same edge of the first electrode perimeter defining trench from which the first length portion of the cavity extends, and
    the first length portion of the cavity is greater than the second length portion of the under-etch cavity.

* * * * *